United States Patent
Lee

(10) Patent No.: US 8,233,860 B2
(45) Date of Patent: Jul. 31, 2012

(54) POWER AMPLIFICATION APPARATUS FOR ENVELOPE MODULATION OF HIGH FREQUENCY SIGNAL AND METHOD FOR CONTROLLING THE SAME

(75) Inventor: Jae-Sub Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 12/927,258

(22) Filed: Nov. 10, 2010

(65) Prior Publication Data
US 2011/0109387 A1    May 12, 2011

(30) Foreign Application Priority Data
Nov. 10, 2009   (KR) .................. 10-2009-0108150

(51) Int. Cl.
*H04B 1/04*    (2006.01)
*H04K 3/00*    (2006.01)

(52) U.S. Cl. .................. 455/127.3; 455/127.4; 330/126

(58) Field of Classification Search .................. 455/108, 455/126, 127.1–127.4; 330/126, 251
See application file for complete search history.

(56) References Cited

U.S. PATENT DOCUMENTS
5,966,051 A * 10/1999 Griffith et al. ................ 330/285
2007/0126501 A1 * 6/2007 Kim et al. ...................... 330/86
* cited by examiner

*Primary Examiner* — Lee Nguyen

(57) ABSTRACT

A power amplification apparatus and method provide for controlling envelope modulation of a Radio Frequency (RF) signal. The power amplification apparatus includes a linear amplifier configured to receive an input signal to be amplified, and generate a linear output signal for compensating for a current ripple of an amplified signal and a switch control signal having a current obtained by dividing the linear output signal by a predetermined ratio. The power amplification apparatus also includes a switching amplifier configured to receive the switch control signal through a multi-mode resistor having a variable resistance, and generate the amplified signal. The variable resistance of the multi-mode resistor determines a switching frequency representing an operating speed of the switching amplifier, and is adjusted according to a communication mode of the input signal.

20 Claims, 7 Drawing Sheets

POWER AMPLIFICATION APPARATUS FOR ENVELOPE MODULATION OF HIGH FREQUENCY SIGNAL AND METHOD FOR CONTROLLING THE SAME

CROSS-REFERENCE TO RELATED APPLICATION(S) AND CLAIM OF PRIORITY

The present application is related to and claims the benefit under 35 U.S.C. §119(a) of a Korean Patent Application filed in the Korean Intellectual Property Office on Nov. 10, 2009 and assigned Serial No. 10-2009-0108150, the entire disclosure of which is hereby incorporated by reference.

TECHNICAL FIELD OF THE INVENTION

The present invention relates generally to a Power Amplifier (PA), and more particularly, to a power amplification apparatus for envelope modulation of Radio Frequency (RF) signals and a method for controlling the same.

BACKGROUND OF THE INVENTION

An apparatus for performing wireless communication in a wireless communication system (for example, a communication terminal or a base station) may include an envelope modulator to amplify RF signals. The envelope modulator includes a linear amplifier and a switching amplifier. The switching amplifier supplies most power for power amplification, and the linear amplifier serves to remove ripples generated in the switching amplifier. Therefore, while the switching amplifier operates in a relatively low frequency band, the linear amplifier should be able to operate in a relatively high frequency band.

In a high-efficiency switching amplifier supplying most power, once an optimal inductance for determining an operating frequency is determined, the operating frequency is fixed to one value, thereby ensuring the optimal efficiency for one target operating frequency.

With the increasing complexity of communication systems and the advent of various communication protocol standards, the envelope modulator is required to operate in one or more operating frequency bands. An envelope modulator that includes one or more operating frequency bands is called a multi-mode envelope modulator, in which the modes mean different communication modes, or different communication protocol standards. For example, the modes may include 3rd Generation Partnership Project (3GPP), Long Term Evolution (LTE), Enhanced Data rates for Global Evolution (EDGE), Code Division Multiple Access (CDMA), Wideband CDMA (WCDMA), Mobile Worldwide interoperability for Microwave Access (Mobile WiMax), and such.

When operating with multiple modes, the envelope modulator can hardly maintain its high efficiency in different modes because a bandwidth and a Peak-to-Average Power Ratio (PAPR) of an input signal are different according to the modes. In particular, compared with the linear amplifier, the switching amplifier, which supplies a substantial amount of current, operates in a low frequency and takes charge of a high-efficiency operation. In a multi-mode operation, if an input bandwidth of the envelope modulator increases, an operating frequency of the switching amplifier should also increase. In this case, if the operating frequency of the switching amplifier is optimized for the highest input frequency, the switching amplifier can no longer perform the optimal operation for the low input frequency, thus reducing the power amplification efficiency.

Designed to be optimized for only one communication mode, communication protocol standard, or operating frequency, the conventional envelope modulator may not ensure its high efficiency when operating with other modes or communication protocols in a system requiring multiple modes.

SUMMARY OF THE INVENTION

To address the above-discussed deficiencies of the prior art, it is a primary object to provide at least the advantages described below. Accordingly, an aspect of embodiments of the present invention is to provide a power amplification apparatus for envelope modulation of RF signals in a multi-mode communication system, and a method for controlling the same.

Another aspect of embodiments of the present invention is to provide an apparatus for supporting high-efficiency amplification of multi-mode input signals, and a method for controlling the same.

Another aspect of embodiments of the present invention is to provide an apparatus for performing high-efficiency amplification on input signals having various bandwidths and PAPRs, and a method for controlling the same.

In accordance with one aspect of the present invention, there is provided a power amplification apparatus for envelope modulation of a Radio Frequency (RF) signal, in which a linear amplifier is configured to receive an input signal to be amplified. The linear amplifier generates a linear output signal $I_{linear}$ for compensating for a current ripple of an amplified signal and a switch control signal $I_{ctl}$ having a current obtained by dividing the linear output signal by a predetermined ratio. The power amplification apparatus also includes a switching amplifier configured to receive the switch control signal through a multi-mode resistor having a variable resistance, and generates the amplified signal. The variable resistance of the multi-mode resistor determines a switching frequency representing an operating speed of the switching amplifier, and is adjusted according to a communication mode of the input signal.

In accordance with another aspect of the present invention, there is provided a method for controlling a power amplification apparatus for envelope modulation of a Radio Frequency (RF) signal. The method includes receiving an input signal to be amplified, and amplifying the input signal by means of the power amplification apparatus. The power amplification apparatus includes a linear amplifier for generating a linear output signal $I_{linear}$ for compensating for a current ripple of an amplified signal and a switch control signal $I_{ctl}$ having a current obtained by dividing the linear output signal by a predetermined ratio. The power amplification apparatus also includes a switching amplifier for receiving the switch control signal through a multi-mode resistor having a variable resistance and generating the amplified signal. The method also includes adjusting the variable resistance of the multi-mode resistor according to a communication mode of the input signal. The variable resistance determines a switching frequency representing an operating speed of the switching amplifier.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, the same drawing reference numerals will be understood to refer to the same elements, features and structures.

DETAILED DESCRIPTION OF THE INVENTION

FIG. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged power amplification apparatus. In the following description, specific details such as detailed configuration and components are merely provided to assist the overall understanding of exemplary embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

Figure 1:
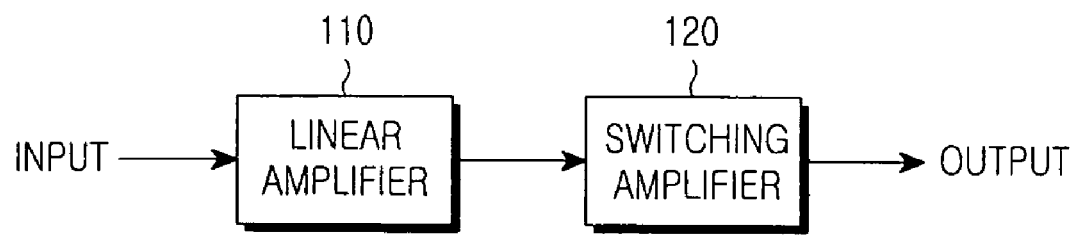
FIG. 1 illustrates an overall structure of a power amplification apparatus according to an embodiment of the present invention.

FIG. 1 illustrates the overall structure of a power amplification apparatus according to an embodiment of the present invention. As shown in the drawing, the power amplification apparatus includes a linear amplifier 110 and a switching amplifier 120. Most amplification of an input signal is achieved in the switching amplifier 120, and the linear amplifier 110 generates a signal for removing ripples generated in the switching amplifier 120, by means of feedback. An output of the linear amplifier 110 is provided to the switching amplifier 120, enabling high-efficiency amplification despite the nonlinear operation of the switching amplifier 120.

The linear amplifier 110 complements the switching amplifier 120 in supplying most of the current required for power amplification. The linear amplifier 110 serves as an independent voltage source. An output voltage $V_{out}$ of the switching amplifier 120 closely or exactly follows a voltage $V_{in}$ of the input signal by means of feedback by the linear amplifier 110. The switching amplifier 120 performs an appropriate operation corresponding to the input voltage $V_{in}$, serving as a dependent current source that supplies most of the current required for power amplification.

Figure 2:
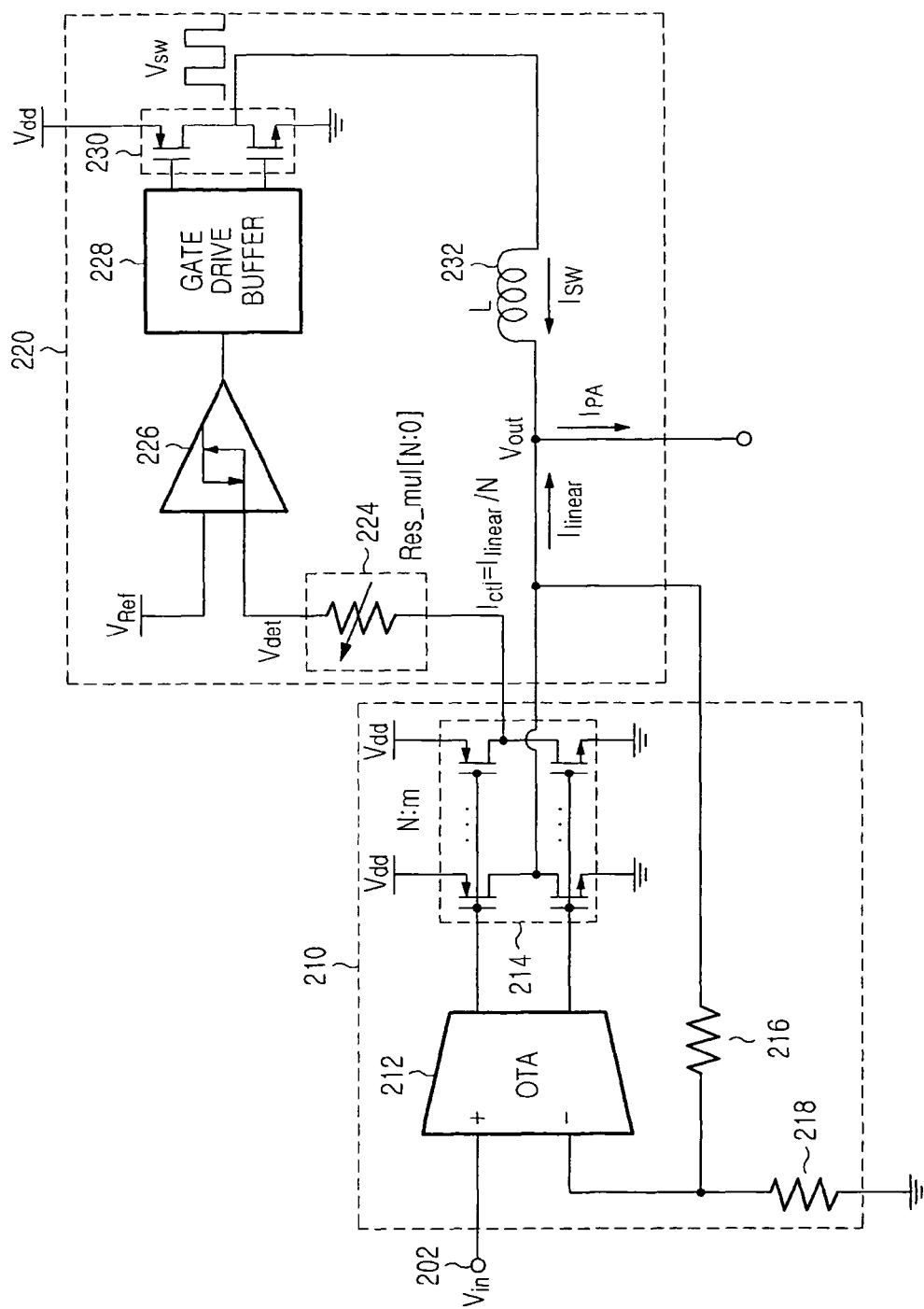
FIG. 2 illustrates a detailed structure of a power amplification apparatus according to an embodiment of the present invention.

FIG. 2 illustrates a detailed structure of a power amplification apparatus according to an embodiment of the present invention. As shown in the drawing, a linear amplifier 210 includes an Operational Trans-conductance Amplifier (OTA) 212, an output stage 214, and resistors 216 and 218. A switching amplifier 220 includes a multi-mode resistor 224, a hysteric comparator 226, a gate drive buffer 228, a switch stage 230, and a smoothing inductor 232.

Referring to FIG. 2, the OTA 212 has a positive (+) input connected to an input terminal $V_{in}$ and a negative (−) input connected to the ground via the pull-down resistor 218. The OTA 212 generates first and second outputs, which are signals inverted to each other. The output stage 214 buffers the outputs of the OTA 212, and generates an output signal $I_{linear}$ of the linear amplifier 210. For example, the output stage 214 includes at least two pairs of Metal-Oxide-Semiconductor Field-Effect Transistors (MOSFETs) connected between a driving power $V_{dd}$ and the ground. Each MOSFET pair includes a P-type MOSFET and an N-type MOSFET.

A first MOSFET pair generates a linear output signal $I_{linear}$, an output of the linear amplifier 210, and a second MOSFET pair and its succeeding MOSFET pairs generate a switch control signal $I_{ctl}$ for the switching amplifier 220. A current of the switch control signal $I_{ctl}$ is determined to be 1/N of the linear output signal $I_{linear}$ ($I_{ctl}=I_{linear}/N$). The output stage 214 shown in FIG. 2 includes two pairs of MOSFETs whose drains are connected to each other, by way of example. However, the output stage 214 may include two or more pairs (i.e., m+1 pairs) of MOSFETs to adjust a current ratio of the switch control signal $I_{ctl}$ to the linear output signal $I_{linear}$, where m is a positive integer greater than 1. In this case, the current ratio of the switch control signal $I_{ctl}$ to the linear output signal $I_{linear}$ is m/N.

A first P-type MOSFET included in the output stage 214 has a source connected to the driving power $V_{dd}$ and a drain that generates the linear output signal $I_{linear}$, an output of the linear amplifier 210. A gate electrode of the P-type MOSFET receives the first output of the OTA 212. A first N-type MOSFET included in the output stage 214 has a source connected to the ground and a drain that generates the linear output signal $I_{linear}$. A gate electrode of the N-type MOSFET receives the second output of the OTA 212.

The two outputs of the OTA 212 are also delivered to gate electrodes of the second pair's MOSFETs constituting the output stage 214. The P-type MOSFET in the second pair has a source connected to the driving power $V_{dd}$ and a drain connected to a drain of an N-type MOSFET, generating the switch control signal $I_{ctl}$. A gate electrode of the P-type MOSFET receives the first output of the OTA 212. The second pair's N-type MOSFET constituting the output stage 214 has a source connected to the ground and a drain that generates the switch control signal $I_{ctl}$. A gate electrode of the N-type MOSFET receives the second output of the OTA 212.

In this structure, the output stage 214 generates a switch control signal $I_{ctl}=m*I_{linear}/N$ obtained by dividing a current of the linear output signal $I_{linear}$ by a ratio of m/N. A value of N is determined according to a channel width ratio of the second MOSFET pair to the first MOSFET pair in a semiconductor process. As mentioned above, a current distribution ratio of the output stage 214 may be adjusted according to the number, m, of the second MOSFET pair and its succeeding MOSFET pairs.

The linear output signal $I_{linear}$ is combined with a switching signal $I_{sw}$ generated in the switching amplifier 220, thereby forming a final output signal $I_{PA}=I_{linear}+I_{sw}$ of the switching amplifier 220. The feedback resistor 216 connects the negative input to the OTA 212 to the output of the linear amplifier 210, thereby causing the output voltage $V_{out}$ of the switching amplifier 220 to closely or exactly follow the input voltage $V_{in}$.

The switch control signal $I_{ctl}$ is delivered to one input of the hysteretic comparator 226 through the multi-mode resistor 224 that includes a variable resistance of $Res_{mul}$. A voltage is dropped across the multi-mode resistor 224 according to the variable resistance $Res_{mul}$, and the dropped or detected voltage being input to the hysteretic comparator 226 is represented by $V_{det}$. A predetermined reference voltage $V_{Ref}$ is received at another input of the hysteretic comparator 226.

A threshold voltage $V_{hys}$ of the hysteretic comparator 226 is determined according to a current feedback factor decided by adjusting a channel width ratio of at least one MOSFET constituting an internal decision circuit. By varying the current feedback factor by making the hysteretic comparator 226 programmable and adjusting a value of $V_{Ref}$, i.e., by realizing the hysteretic comparator 226 with a programmable hysteretic comparator, the threshold voltage $V_{hys}$ may be adjusted according to the communication mode used. The variable resistance of the multi-mode resistor 224, the current ratio N:m of the output stage 214, and the threshold voltage $V_{hys}$ of the hysteretic comparator 226 may be controlled according to the present mode in operation among the multiple modes, and these values are controlled according to, for example, a control signal from a modem (not shown).

When the voltage $V_{det}$ dropped by the multi-mode resistor 224 exceeds the threshold voltage $V_{hys}$, an output of the hysteretic comparator 226 is changed from Off '0' to On '1', operating (activating) the switch stage 230 through the gate drive buffer 228. First and second outputs of the gate drive buffer 228 are signals inverted to each other. The gate drive buffer 228 may be optionally provided to quickly deliver the output of the hysteretic comparator 226 to the switch stage 230.

The switch stage 230 includes a pair of MOSFETs. For a P-type MOSFET included in the switch stage 230, either one of its drain and source electrodes is connected to the driving power $V_{dd}$ and the other one generates a switching signal ($V_{sw}$, $I_{sw}$). A gate electrode of the P-type MOSFET receives the first output of the gate drive buffer 228. For an N-type MOSFET included in the switch stage 230, either one of its drain and source electrodes is connected to the ground and the other one generates the switching signal ($V_{sw}$, $I_{sw}$). A gate electrode of the N-type MOSFET receives the second output of the gate drive buffer 228.

The switching signal is combined with the output signal $I_{linear}$ of the linear amplifier 210 at an output terminal 222 of the switching amplifier 220 after passing through the smoothing inductor 232 that includes an inductance L, thereby forming a final output signal $I_{PA}=I_{linear}+I_{sw}$ of the switching amplifier 220.

Figure 3A:
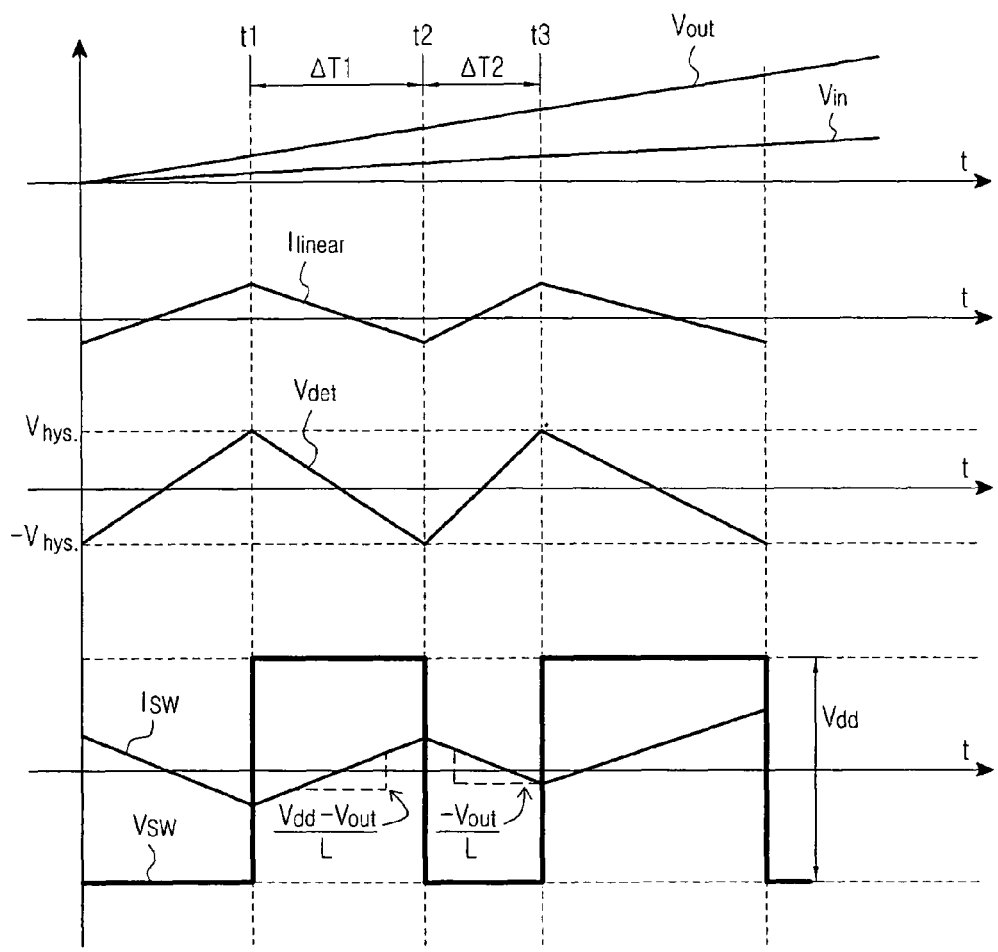
FIGS. 3A and 3B illustrate operation waveforms of a power amplification apparatus according to an embodiment of the present invention.
Figure 3B:
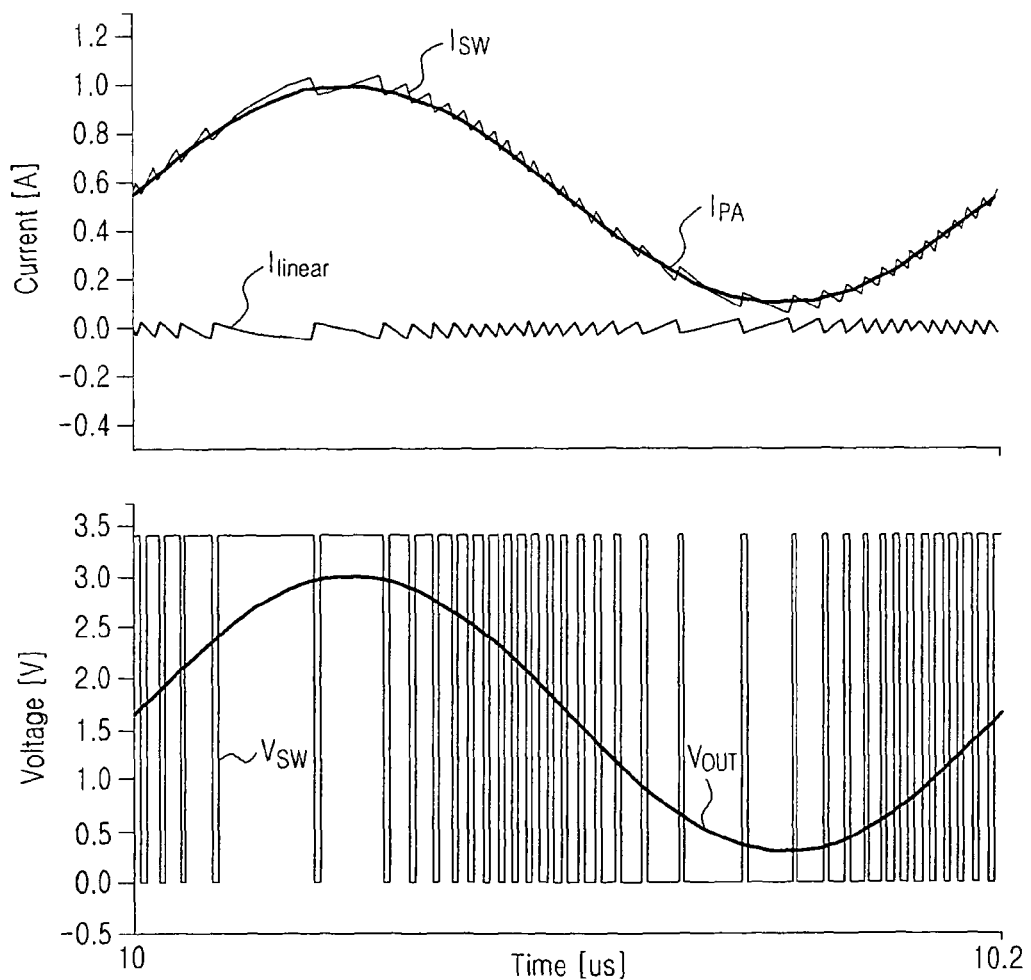

FIGS. 3A and 3B illustrate operation waveforms of a power amplification apparatus according to an embodiment of the present invention.

As shown in FIG. 3A, if the voltage $V_{in}$ of the input signal increases, $I_{linear}$ increases by means of the OTA 212 and $V_{det}$ also increases due to the increase in $I_{linear}$. At a time t1 the $V_{det}$ exceeds the threshold voltage $V_{hys}$ of the hysteretic comparator 226, the output of the hysteretic comparator 226 changes from '0' to '1', activating the switch stage 230 to increase the current $I_{sw}$ of the switching signal. An output voltage $V_{sw}$ of the switch stage 230 is maintained at $V_{dd}$ for a period $\Delta T1$. In this period, a slope of the increase in $I_{sw}$ is $(V_{dd}-V_{out})/L$. The output voltage $V_{sw}$ of the switch stage 230 corresponds to a waveform obtained by performing Pulse Width Modulation (PWM) on the increase/decrease in $V_{det}$ or the value of $V_{hys}$.

If $V_{det}$ continuously decreases after the time t1, dropping below a negative threshold voltage $-V_{sys}$, then the output of the hysteretic comparator 226 is changed again from '1' to '0' at a time t2. Thus, $I_{sw}$ decreases along the slope equal to $-V_{out}/L$, and $V_{sw}$ is maintained at $-V_{dd}$ for a period $\Delta T2$. The slope of the $I_{sw}$ in each period can be calculated using Equation [1] below.

$$\frac{\Delta I_{sw}}{\Delta T1} = \frac{V_{dd}-V_{out}}{L} \quad \text{[Eqn. 1]}$$

$$\frac{\Delta I_{sw}}{\Delta T2} = \frac{-V_{out}}{L}$$

$$\Delta I_{sw} = -\Delta I_{linear}$$

The output of the hysteretic comparator 226 is continuously switched on and off repeatedly in this way, causing ripples of $I_{sw}$. As shown in FIG. 3B, the $I_{sw}$ provides most of the current necessary for power amplification, but contains ripples that cause the nonlinearity of power amplification. Since $I_{linear}$ has waveforms exactly inverted to those of the ripples of $I_{sw}$, the total current $I_{PA}$ of the final output signal is determined by compensating for the ripples of $I_{linear}$, and its voltage $V_{out}$ is determined according to $I_{PA}$.

A switching frequency $f_{sw}$ of the switching signal $V_{sw}$, representing an operating speed of the switching amplifier 220, and its maximum value $f_{sw-Max}$ are a function of a threshold voltage $V_{hys}$ of the hysteretic comparator 226, a current distribution ratio N of the output stage 214, an inductance L of the smoothing inductor 232, and a variable resistance $Res_{mul}$ of the multi-mode resistor 224, and are determined by Equation [2] below.

$$f_{sw} = \frac{Res_{mul} \times V_{out}(V_{dd}-V_{out})}{2 \times V_{dd} \times N \times L \times V_{hys}} \quad \text{[Eqn. 2]}$$

$$f_{sw-Max} = \frac{Res_{mul} \times V_{dd}}{8 \times N \times L \times V_{hys}}$$

In order to support two modes having different PAPRs, $I_{sw}$ most affecting $I_{PA}$ should be appropriately adjusted. As described above, as $V_{in}$ increases, $V_{out}$ increases by means of the feedback of the linear amplifier 210 and $I_{ctl}$ is converted into $V_{det}$ by $Res_{mul}$, automatically increasing the current $I_{sw}$ of the switching amplifier 220. Sine $V_{out}$ increases along $V_{in}$ by the feedback, $I_{PA}$ also increases. Therefore, $I_{linear}$ decreases automatically. This automatic adjustment (or calibration) is applied in the same way even when $V_{in}$ is reduced.

In an embodiment of the present invention, by variably adjusting at least one of the parameters $Res_{mul}$, N and $V_{hys}$, the switching frequency is appropriately adjusted according to the communication mode in use, i.e., the signal bandwidth and PAPR of the input signal. As an example, if an input signal $V_{in}$ having a wide signal bandwidth and a high PAPR is provided, $V_{in}$ rapidly changes and its variation is significant. In order to rapidly keep up the change in $V_{in}$, $f_{sw}$ should be relatively high. In the opposite case, it is preferable for $f_{sw}$ to be relatively low. In order to adjust the at least one parameter, a control signal from, for example, a modem (not shown) or an external console may be used. The adjusted value is determined through experiments to be appropriate for the communication mode, or appropriately determined by the system designer or operator.

In a system having a very high PAPR, like in the LTE or Mobile WiMax system, a Slew Rate (SR) representing the maximum rate associated with the change in output voltage should be properly determined. In the switching amplifier 220, the smoothing inductor 232 has a relatively large inductance to increase the SR. When the current is insufficient to reach the required SR limit, the linear amplifier 210 having a relatively high SR automatically supplies the required current $I_{linear}$. Hence, the power amplification apparatus of FIG. 2 may operate with high efficiency for various PAPRs.

Figure 4A:
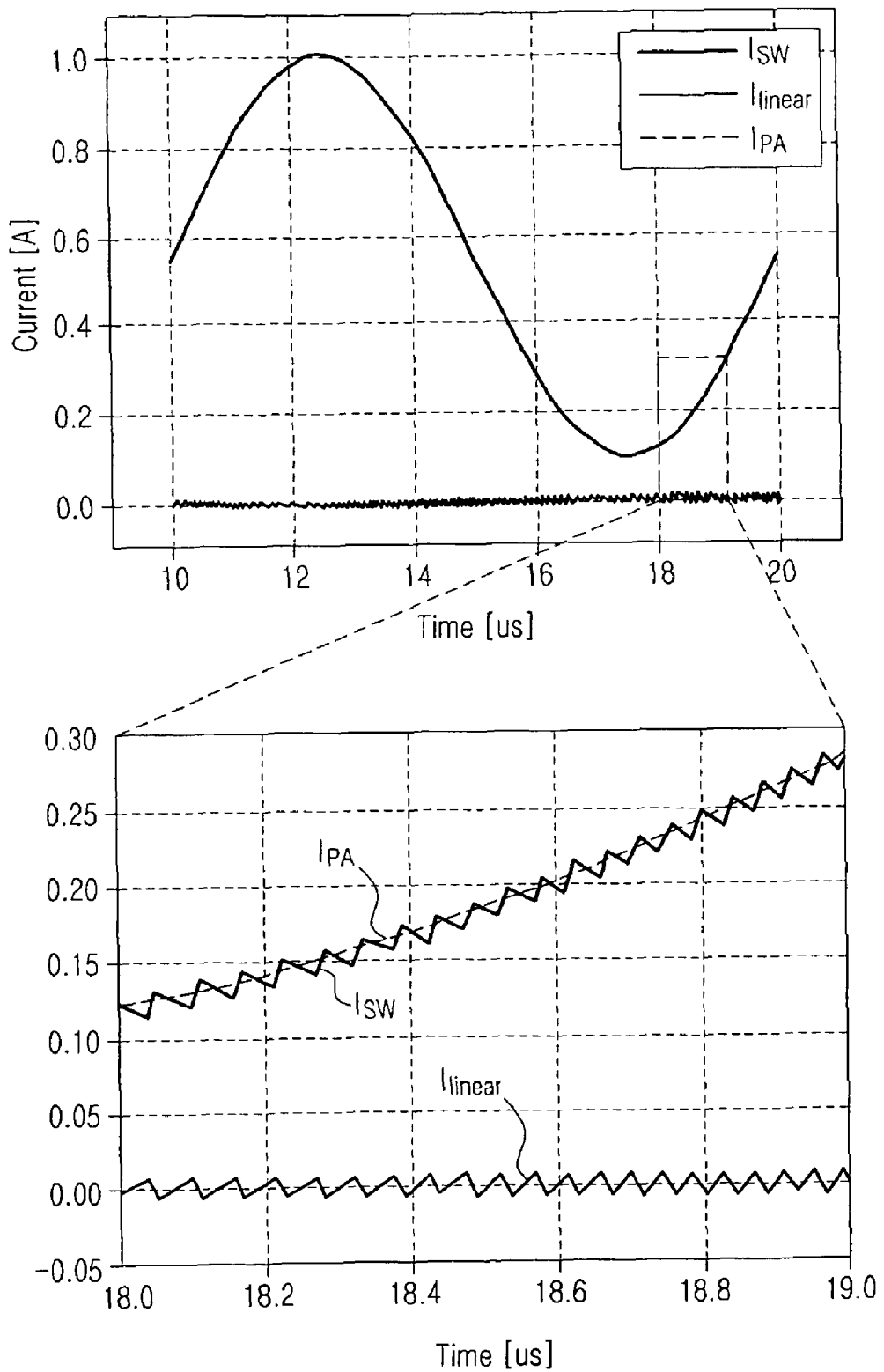
FIGS. 4A and 4B are waveform diagrams illustrating an operation of controlling a switching frequency $f_{sw}$ based on variable resistance.
Figure 4B:
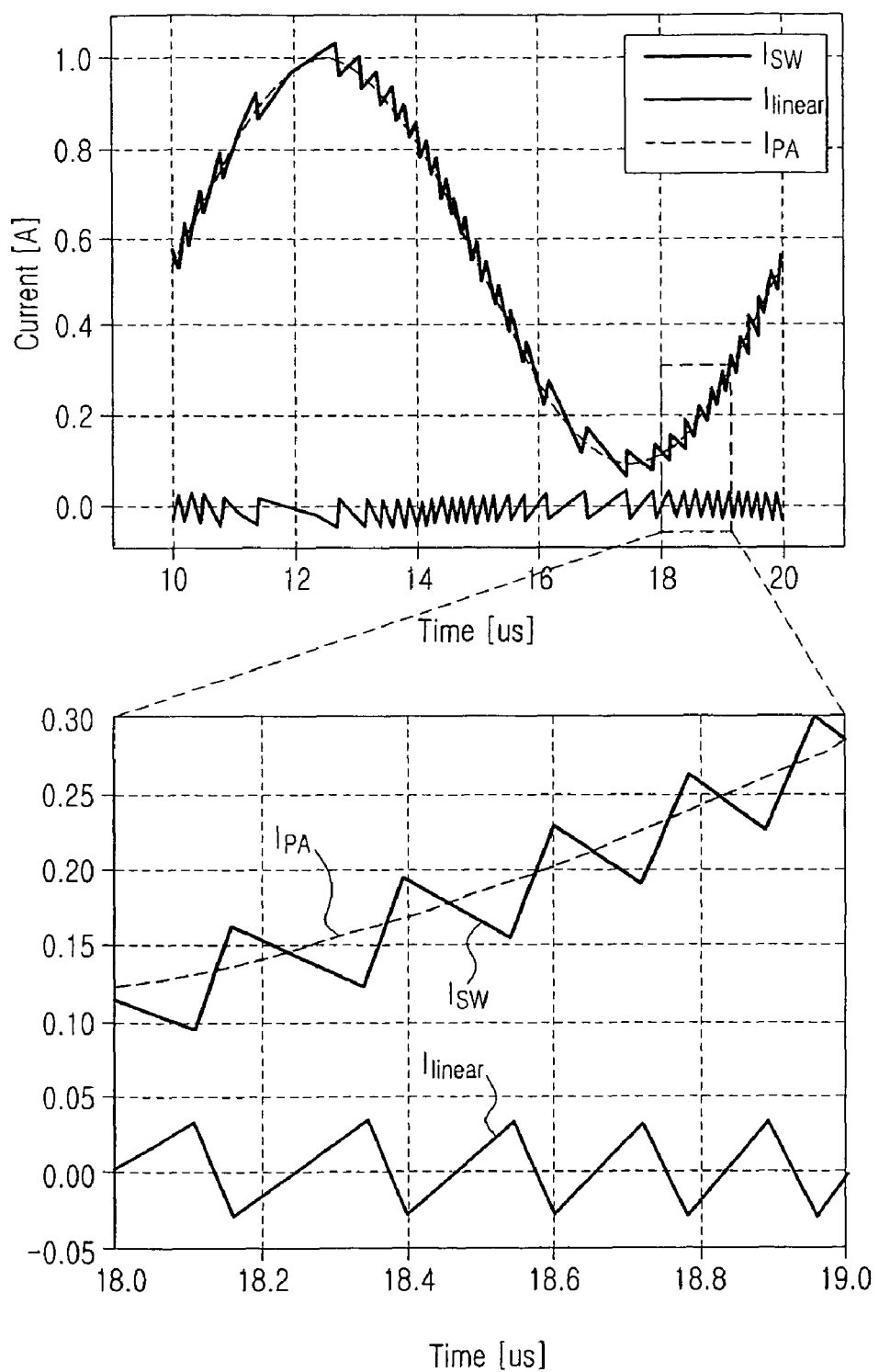

FIGS. 4A and 4B are waveform diagrams illustrating an operation of controlling a switching frequency $f_{sw}$ based on variable resistance. To be specific, FIG. 4A shows waveforms of $I_{sw}$, $I_{linear}$ and $I_{PA}$ in the case where a fast switching frequency of approximately 20 MHz is used (i.e., in the case of a high $f_{sw}$), and FIG. 4B shows waveforms of $I_{sw}$, $I_{linear}$ and $I_{PA}$ in the case where a slow switching frequency of approximately 5 MHz is used (i.e., in the case of a low $f_{sw}$). As illustrated, for fast switching, $Res_{mul}$ is adjusted to a larger value to compensate for fast ripples of $I_{sw}$ by $I_{linear}$ as shown in FIG. 4A. For slow switching, $Res_{mul}$ is adjusted to a smaller value to compensate for relatively slow ripples of $I_{sw}$ by $I_{linear}$ as shown in FIG. 4B.

As described above, in the power amplification apparatus according to the present invention, $V_{det}$ determined by $m*I_{linear}/N$ may be adjusted by adjusting $Res_{mul}$ of the multi-mode resistor 224, and accordingly, the switching frequency $f_{sw}$ is adjusted.

Power losses in the switching amplifier 220 and the linear amplifier 210, which are caused by $f_{sw}$, are represented as Equation [3] below.

$$P_{sw} = K1 \times f_{sw}$$
$$P_{linear} = K2 \times \frac{1}{f_{sw}}$$
$$P_{total} = P_{sw} + P_{linear} = K1 \times f_{sw} + K2 \times \frac{1}{f_{sw}}$$

[Eqn. 3]

where $P_{sw}$ means a power loss in the switching amplifier 220, $P_{linear}$ means a power loss in the linear amplifier 210, $P_{total}$ denotes the total power loss, and K1 and K2 are constants representing linear changes in $P_{sw}$ and $P_{linear}$ due to $f_{sw}$, respectively.

It can be appreciated that based on Equation (3) above, the total power loss of the power amplification apparatus may be reduced by selecting $f_{sw}$ to have an appropriate value. When the signal bandwidth is changed according to the communication mode, $Res_{mul}$ is controlled more precisely to properly adjust $f_{sw}$.

Figure 5:
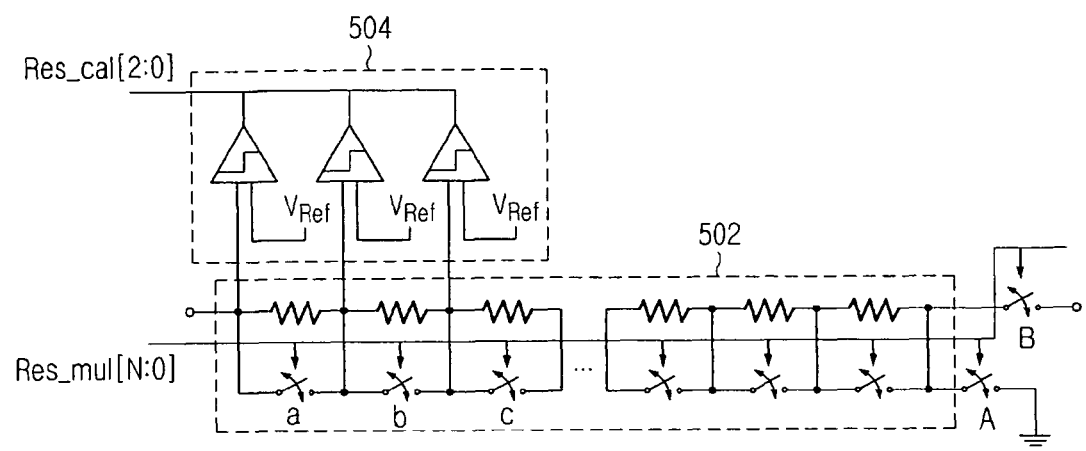
FIG. 5 illustrates a detailed structure of an adjustable multi-mode resistor according to an embodiment of the present invention.

FIG. 5 illustrates a detailed structure of an adjustable multi-mode resistor 224 according to an embodiment of the present invention. As illustrated, the multi-mode resistor 224 includes a resistor bank 502 including a plurality of resistors which are connected to each other in series and can be switched on/off, and a digital calibration unit 504 connected to a plurality of resistors in the resistor bank 502. Each resistor in the resistor bank 502 is connected in parallel to its switch, and each switch is on/off-controlled by a control signal Res_mul [N:0] from a modem, where N means the number of resistors controllable in the resistor bank 502.

The digital calibration unit 504 includes a plurality of comparators that correspond to their connected resistors and compare voltages received from the resistors with a specific reference voltage $V_{Ref}$. Outputs Res_cal of the comparators are used as measurement values for digital calibration. In addition, a switch A and a switch B are further provided. The switch A connects the multi-mode resistor 224 from the output stage 214 of the linear amplifier 210 to the ground, for a digital calibration operation, and the switch B connects the multi-mode resistor 224 from the output stage 214 to the hysteretic comparator 226 after completion of the digital calibration operation.

In the following description, it will be assumed that the first three resistors in the resistor bank 502 are used for digital calibration, by way of example.

Initially, an operation for digital calibration is carried out. During digital calibration, a test current is applied to the entire resistor bank 502, with the switch A turned on, the switch B turned off, and all the other switches turned off. Then, each comparator in the digital calibration unit 504 compares a voltage dropped at a front end of its connected resistor with the reference voltage $V_{Ref}$, and outputs '1' if the voltage is greater than $V_{Ref}$, and '0' if less than $V_{Ref}$. The comparison result in each comparator is measured as Res_cal [2:0].

Based on the measured value of Res_cal [2:0], turning on/off of the first three resistors is determined. For example, if Res_cal [2:0] is '110', a desired voltage is obtained at the third resistor. So, the first and second resistors are disabled by turning on switches 'a' and 'b' connected in parallel to the first and second resistors, and the third resistor is enabled by turning off a switch 'c' connected in parallel to the third resistor. As another example, if Res_cal [2:0] is '100', a desired voltage is obtained at the second resistor. So, the second and third resistors are enabled by turning on the switch 'a' and turning off the switches 'b' and 'c'.

If the digital calibration is completed, the multi-mode resistor 224 is connected between the output stage 214 of the linear amplifier 210 and the hysteretic comparator 226, with the switch A turned off, the switch B turned on, and all the switches for a fourth resistor and its succeeding resistors turned off.

If operations of the linear amplifier 210 and the switching amplifier 220 are started, the control signal Res_mul [N:0] received from the modem adjusts the variable resistance $Res_{mul}$ more accurately and precisely by individually turning on/off the switch connected in parallel to each resistor in the resistor bank 502. Likewise, the switching frequency $f_{sw}$ is accurately and precisely adjusted by adjusting the variable resistance $Res_{mul}$.

As is apparent from the foregoing description, embodiments of the present invention have the following effects.

A high-efficiency power amplification operation may be performed for multiple modes that generate input signals having different bandwidths and/or PAPRs.

A high-efficiency power amplification operation may be performed, even though the bandwidth and/or PAPR of an input signal are varied according to the communication mode used.

By supporting multiple communication modes or communication protocol standards with one power amplification apparatus, it is possible to make low-cost small communication modules compared to using multiple power amplifiers.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A power amplification apparatus for envelope modulation of a Radio Frequency (RF) signal, comprising:
a linear amplifier configured to receive an input signal to be amplified, and generate a linear output signal $I_{linear}$ for compensating for a current ripple of an amplified signal and a switch control signal $I_{ctl}$ having a current obtained by dividing the linear output signal by a predetermined ratio; and
a switching amplifier configured to receive the switch control signal through a multi-mode resistor having a variable resistance, and generate the amplified signal;
wherein the variable resistance of the multi-mode resistor determines a switching frequency representing an operating speed of the switching amplifier, and is adjusted according to a communication mode of the input signal.

2. The power amplification apparatus of claim 1, wherein the variable resistance is adjusted according to at least one of a signal bandwidth and a Peak-to-Average Power Ratio (PAPR) of the input signal.

3. The power amplification apparatus of claim 1, wherein the linear amplifier comprises:
an Operational Trans-conductance Amplifier (OTA) configured to receive an input signal as a positive input and generate first and second outputs inverted to each other;
an output stage configured to receive the first and second outputs and generating the linear output signal $I_{linear}$ and the switch control signal $I_{ctl}$; and
a feedback resistor configured to feed back the switch control signal $I_{ctl}$ as a negative input to the OTA.

4. The power amplification apparatus of claim 3, wherein a current ratio of the switch control signal $I_{ctl}$ to the linear output signal $I_{linear}$ is adjusted according to at least one of a signal bandwidth and a PAPR of the input signal.

5. The power amplification apparatus of claim 3, wherein the output stage comprises a plurality of Metal-Oxide-Semiconductor Field-Effect Transistors (MOSFETs) connected between a driving power and a ground.

6. The power amplification apparatus of claim 5, wherein the plurality of MOSFETs comprises a P-type MOSFET and an N-type MOSFET.

7. The power amplification apparatus of claim 1, wherein the switching amplifier comprises:
the multi-mode resistor having an end connected to the switch control signal;
a hysteretic comparator defining another end of the multi-mode resistor as a first input and a predetermined reference voltage as a second input, and configured to compare a signal received through the multi-mode resistor with an adjustable threshold voltage;
a switch stage configured to output a switching signal, a current of which increases or decreases according to an output of the hysteretic comparator; and
a smoothing inductor configured to connect the switching signal to a final output terminal.

8. The power amplification apparatus of claim 7, wherein an inductance of the smoothing inductor is adjusted according to at least one of a signal bandwidth and a PAPR of the input signal.

9. A method for controlling a power amplification apparatus for envelope modulation of a Radio Frequency (RF) signal, comprising:
receiving an input signal to be amplified, and amplifying the input signal by means of the power amplification apparatus, the power amplification apparatus comprising:
a linear amplifier for generating a linear output signal $I_{linear}$ for compensating for a current ripple of an amplified signal and a switch control signal $I_{ctl}$ having a current obtained by dividing the linear output signal by a predetermined ratio, and
a switching amplifier for receiving the switch control signal through a multi-mode resistor having a variable resistance and generating the amplified signal; and
adjusting the variable resistance of the multi-mode resistor according to a communication mode of the input signal, wherein the variable resistance determines a switching frequency representing an operating speed of the switching amplifier.

10. The method of claim 9, wherein the variable resistance is adjusted according to at least one of a signal bandwidth and a Peak-to-Average Power Ratio (PAPR) of the input signal.

11. The method of claim 9, wherein the linear amplifier comprises:
an Operational Trans-conductance Amplifier (OTA) for receiving an input signal as a positive input and generating first and second outputs inverted to each other;
an output stage for receiving the first and second outputs and generating the linear output signal $I_{linear}$ and the switch control signal $I_{ctl}$; and
a feedback resistor for feeding back the switch control signal $I_{ctl}$ as a negative input to the OTA;
wherein a current ratio of the switch control signal $I_{ctl}$ to the linear output signal $I_{linear}$ is adjusted according to at least one of a signal bandwidth and a PAPR of the input signal.

12. The method of claim 9, wherein the switching amplifier comprises:
the multi-mode resistor having an end connected to the switch control signal;
a hysteretic comparator defining another end of the multi-mode resistor as a first input and a predetermined reference voltage as a second input, and comparing a signal received through the multi-mode resistor with an adjustable threshold voltage;
a switch stage for outputting a switching signal, a current of which increases or decreases according to an output of the hysteretic comparator; and
a smoothing inductor for connecting the switching signal to a final output terminal;
wherein an inductance of the smoothing inductor is adjusted according to at least one of a signal bandwidth and a PAPR of the input signal.

13. For use in a wireless communication system, a communication terminal configured to operate in a plurality of frequency bands, the communication terminal comprising:
at least one antenna; and
a power amplification apparatus coupled to the at least one antenna and configured for envelope modulation of a Radio Frequency (RF) signal, the power amplification apparatus comprising:

a linear amplifier configured to receive an input signal to be amplified, and generate a linear output signal $I_{linear}$ for compensating for a current ripple of an amplified signal and a switch control signal $I_{ctl}$ having a current obtained by dividing the linear output signal by a predetermined ratio; and a switching amplifier configured to receive the switch control signal through a multi-mode resistor having a variable resistance, and generate the amplified signal;

wherein the variable resistance of the multi-mode resistor determines a switching frequency representing an operating speed of the switching amplifier, and is adjusted according to a communication mode of the input signal.

14. The communication terminal of claim 13, wherein the variable resistance is adjusted according to at least one of a signal bandwidth and a Peak-to-Average Power Ratio (PAPR) of the input signal.

15. The communication terminal of claim 13, wherein the linear amplifier comprises:
   an Operational Trans-conductance Amplifier (OTA) configured to receive an input signal as a positive input and generate first and second outputs inverted to each other;
   an output stage configured to receive the first and second outputs and generating the linear output signal $I_{linear}$ and the switch control signal $I_{ctl}$; and
   a feedback resistor configured to feed back the switch control signal $I_{ctl}$ as a negative input to the OTA.

16. The communication terminal of claim 15, wherein a current ratio of the switch control signal $I_{ctl}$ to the linear output signal $I_{linear}$ is adjusted according to at least one of a signal bandwidth and a PAPR of the input signal.

17. The communication terminal of claim 15, wherein the output stage comprises a plurality of Metal-Oxide-Semiconductor Field-Effect Transistors (MOSFETs) connected between a driving power and a ground.

18. The communication terminal of claim 17, wherein the plurality of MOSFETs comprises a P-type MOSFET and an N-type MOSFET.

19. The communication terminal of claim 13, wherein the switching amplifier comprises:
   the multi-mode resistor having an end connected to the switch control signal;
   a hysteretic comparator defining another end of the multi-mode resistor as a first input and a predetermined reference voltage as a second input, and configured to compare a signal received through the multi-mode resistor with an adjustable threshold voltage;
   a switch stage configured to output a switching signal, a current of which increases or decreases according to an output of the hysteretic comparator; and
   a smoothing inductor configured to connect the switching signal to a final output terminal.

20. The communication terminal of claim 19, wherein an inductance of the smoothing inductor is adjusted according to at least one of a signal bandwidth and a PAPR of the input signal.

* * * * *